(12) United States Patent  
Wang et al.

(10) Patent No.: US 8,299,567 B2
(45) Date of Patent: Oct. 30, 2012

(54) STRUCTURE OF METAL E-FUSE (75) Inventors: Ping-Chuan Wang, Hopewell Junction, NY (US); Chunyan E Tian, Hopewell Junction, NY (US); Ronald Filippi, Hopewell Junction, NY (US); Wai-kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 12/952,317

(22) Filed: Nov. 23, 2010

(65) Prior Publication Data
US 2012/0126363 A1    May 24, 2012

(51) Int. Cl.
 *H01L 29/00*    (2006.01)
(52) U.S. Cl. ................... 257/529; 257/751; 438/643
(58) Field of Classification Search ............... 257/529, 257/751, E23.149; 438/643
See application file for complete search history.

(56) References Cited

U.S. PATENT DOCUMENTS

| | | | |
|---|---|---|---|
| 5,741,625 A | 4/1998 | Bae et al. | |
| 6,015,650 A | 1/2000 | Bae | |
| 6,100,116 A | 8/2000 | Lee et al. | |
| 6,368,902 B1 | 4/2002 | Kothandaraman et al. | |
| 6,444,503 B1 | 9/2002 | Yu | |
| 6,521,971 B2 | 2/2003 | Tsai | |
| 6,555,458 B1 | 4/2003 | Yu | |
| 6,933,591 B1 | 8/2005 | Sidhu et al. | |
| 7,205,588 B2 | 4/2007 | Jeng et al. | |
| 7,227,207 B2 | 6/2007 | Park et al. | |
| 7,585,614 B2 | 9/2009 | Furukawa et al. | |
| 7,667,289 B2 | 2/2010 | Lin et al. | |
| 7,862,982 B2 | 1/2011 | Burns et al. | |
| 8,164,190 B2 * | 4/2012 | Filippi et al. | 257/751 |
| 2008/0217735 A1 | 9/2008 | Chen et al. | |
| 2010/0038747 A1 | 2/2010 | Chanda et al. | |
| 2011/0049680 A1 | 3/2011 | Burns et al. | |

* cited by examiner

*Primary Examiner* — Phuc Dang
(74) *Attorney, Agent, or Firm* — Yuanmin Cai (57) ABSTRACT

Structures of electronic fuses (e-fuse) are provided. An unprogrammed e-fuse includes a via of a first conductive material having a bottom and sidewalls with a portion of the sidewalls being covered by a conductive liner and the bottom of the via being formed on top of a dielectric layer, and a first and a second conductive path of a second conductive material formed on top of the dielectric layer with the first and second conductive paths being conductively connected through, and only through, the via at the sidewalls. A programmed e-fuse includes a via; a first conductive path at a first side of the via and being separated from sidewalls of the via by a void; and a second conductive path at a second different side of the via and being in conductive contact with the via through sidewalls of the via.

16 Claims, 8 Drawing Sheets

FIG. 7(a) (Prior Art) Before programming

FIG. 7(b) (Prior Art) After programming

STRUCTURE OF METAL E-FUSE

FIELD OF THE INVENTION

The present invention relates generally to the field of semiconductor device manufacturing and in particular relates to structure of metal e-fuses and their operation.

BACKGROUND

In semiconductor integrated circuitry, one time programmable (OTP) electronic fuse (e-fuse) is known as a critical device, which is often and generally used to build redundancy for various mission-critical components in a chip for self-repairing purpose in situations where a critical device fails; for improving overall yield of the integrated circuit (IC) chip by providing the chip with functionality of post manufacturing configuration; and for enabling programming of certain security features such as, for example, electronic chip identification (ECID). As complementary metal-oxide-semiconductor (CMOS) technology scales down and more recently the adoption of high-k metal gate, metal e-fuses are being gradually used to replace conventional salicided polysilicon e-fuses.

Figure 7A:
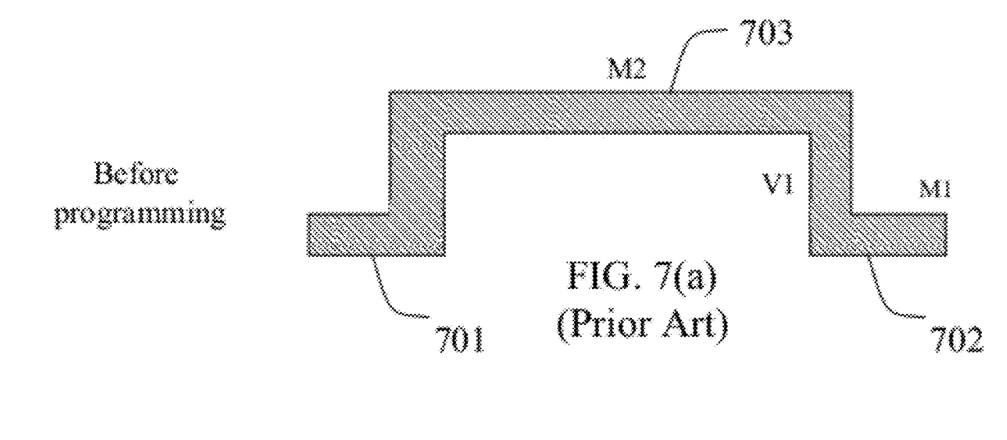
FIGS. 7(a) and 7(b) are simplified illustrations of an electronic fuse as is known in the art.
Figure 7B:
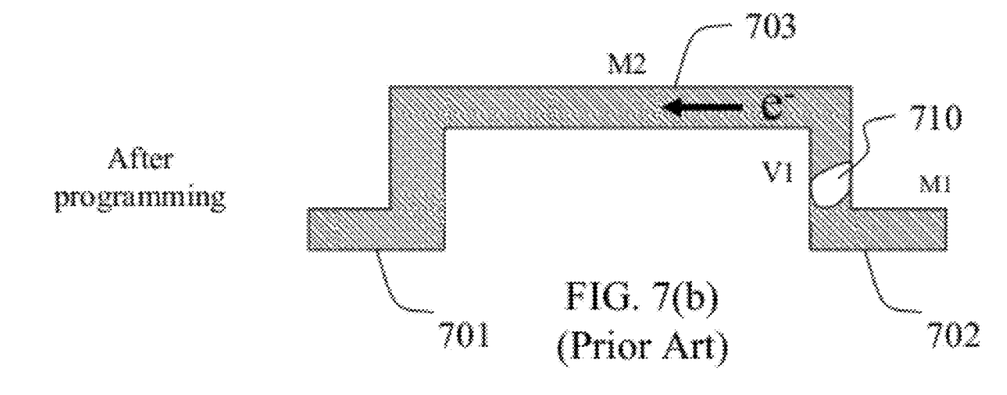

FIGS. 7(a) and 7(b) are simplified illustrations of a typical metal e-fuse, before and after being programmed, as is known in the art. Metal e-fuse 700 is normally composed of a metal link 703 (known in the art as "M2") terminated at two ends 701 and 702 by vias (known in the art as "V1") and wirings (known in the art as "M1"). Upon programming, as illustrated in FIG. 7(b), excessive current of electrons is driven through M2 metal link as a mean to induce electro-migration voiding at flux divergence sites. Frequently, such voiding develops at the bottom of a terminating via, such as void 710 at V1 via, where flux divergence usually occurs and where liner and metal coverage of V1 via may not be well controlled during manufacturing of V1 via and M2 metal link. Nevertheless, it has been observed as well that voiding sometimes may occur in the M1 or M2 wirings, impacting programming reproducibility of e-fuses that employ the structure shown in FIG. 7(a).

In general, there are mainly two types of metal e-fuses being reported so far that are both programmed by employing metal electro-migration (EM) mechanism under controlled flow of electron current. A first type of metal e-fuses functions through the creation of a void in the wire, such as copper (Cu) wire, by the wire EM (wire mode). A second type of metal e-fuse functions through the creation of a void in the via by the via EM (via mode). However, both types of e-fuse or e-fuse operation modes carry certain concerns and reliability issues including (1) programmability (voiding location being unpredictable) and (2) reliability (possibility of out-diffusion of metal after programming).

The major concern for the wire mode e-fuse includes that it is generally difficult to control and re-produce void location as well as void size in order to achieve tight distribution of post-programming e-fuse resistance. With a wide, and sometimes un-controlled, distribution of e-fuse post-programming resistance, it becomes very difficult to characterize reliability of such programmed e-fuse to provide any meaningful guarantee for the safe use of it. On the other hand, there is reliability issue as well with the via mode e-fuse. For example, it is hard to contain metal out-diffusion, usually copper, to prevent collateral damage to neighboring devices both during and post metal e-fuse programming. Such damages may include, for example, causing a neighboring metal line or via to change resistance, metal short or open, as well as ILD (intra or inter level dielectric) leakage increase or failure.

SUMMARY

Embodiments of the present invention provide a semiconductor structure. The semiconductor structure includes a via of a first conductive material having a bottom and sidewalls, at least a portion of the sidewalls being covered by a conductive liner, the bottom of the via being formed on top of a dielectric layer; and a first and a second conductive path of a second conductive material formed on top of the dielectric layer, the first and second conductive paths being conductively connected through, and only through, the via at the sidewalls.

In one embodiment, conductivity of at least the first conductive path is greater than conductivity of the conductive liner covering the via at the portion of the sidewalls. In another embodiment, the portion of the sidewalls is a sidewall between the first conductive path and the via.

In one embodiment, at least one void exists inside the first conductive path at a location adjacent to the portion of the sidewalls, wherein the at least one void being caused by electro-migration and occupying more than half of a cross-section of the first conductive path.

In one embodiment, the first conductive material is selected from a group consisting of tungsten (W), aluminum (Al), copper (Cu), silver (Ag), gold (Au), and alloy thereof, and the second conductive material is selected from a group consisting of aluminum (Al), copper (Cu), silver (Ag), gold (Au), and alloy thereof. In another embodiment, the conductive liner is made of a material being selected from a group consisting of titanium (Ti), tantalum (Ta), ruthenium (Ru), tungsten (W), titanium-nitride (TiN), tantalum-nitride (TaN), ruthenium-nitride (RuN), and tungsten-nitride (WN), and the conductive liner is capable of preventing the first conductive material of the via from diffusing there-through.

Embodiments of the present invention provide an electronic fuse (e-fuse). The e-fuse includes a via of a first conductive material having a bottom and sidewalls with the bottom being formed directly on top of a dielectric layer; a first conductive path being formed on top of the dielectric layer at a first side of the via and being separated from the sidewalls of the via by a void; and a second conductive path being formed on top of the dielectric layer at a second different side of the via and being in conductive contact with the via through the sidewalls, wherein a portion of the sidewalls being separated from the first conductive path is covered by a conductive liner, and wherein the first and second conductive paths being made of a second conductive material.

Embodiments of the present invention provide another electronic fuse (e-fuse). The e-fuse includes a via of a first conductive material having a bottom and sidewalls, the sidewalls being covered by a conductive liner, the bottom being formed on top of a dielectric layer; and a first and a second conductive path of a second conductive material formed on top of the dielectric layer, the first and second conductive paths being conductively connected through, and only through, the via at the sidewalls. Additionally, the e-fuse may include a metal contact layer formed on top of and in conductive contact with the via, the metal contact layer being conductively insulated from the first and second conductive paths via a dielectric layer except through the via.

In one embodiment, the second conductive path is adapted to pass an electron current represented by a flow of electrons in a direction towards the first conductive path through the via, the flow of electrons being sufficiently large to create a void in the first conductive path at a location adjacent to the sidewalls facing the first conductive path.

In another embodiment, the metal contact layer is adapted to pass an electric current through the via and through the second conductive path to confirm electronic continuity thereof after the void being created inside the first conductive path next to the via.

In yet another embodiment, no electric current is able to pass from the metal contact layer through the via and through the first conductive path after the void is created.

BRIEF DESCRIPTION OF THE DRAWINGS

The present invention will be understood and appreciated more fully from the following detailed description of the invention, taken in conjunction with the accompanying drawings of which.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE EMBODIMENTS

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

Figure 1A:
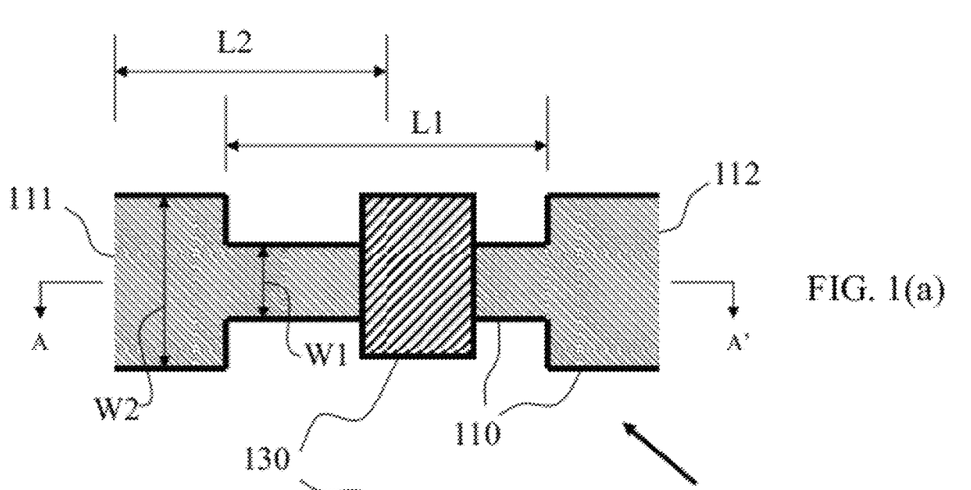
FIGS. 1(a) and 1(b) are demonstrative illustrations of top and side views of structure of an electronic fuse (e-fuse) manufactured according to one embodiment of the present invention.
Figure 1B:
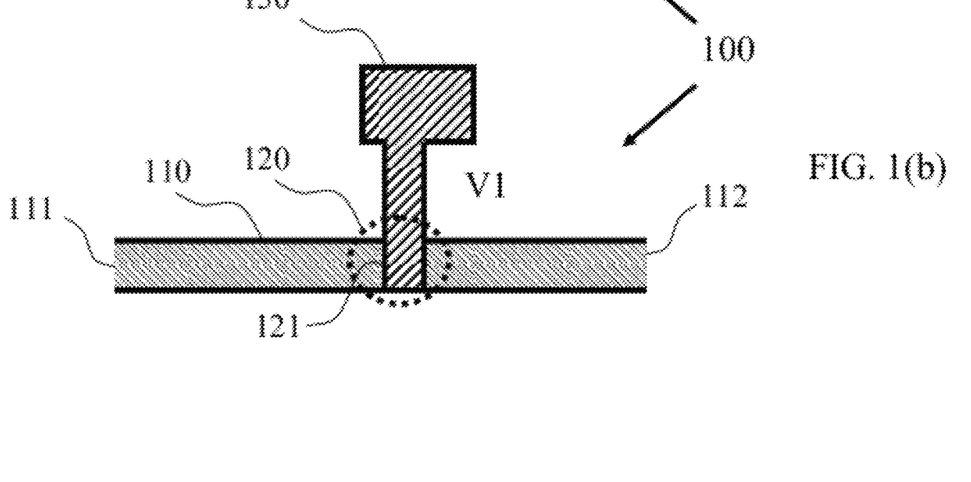

FIGS. 1(a) and 1(b) are demonstrative illustrations of top and side views of the structure of an electronic fuse (e-fuse) according to one embodiment of the invention. More specifically, e-fuse 100 may include an M1 metal wire or metal link 110 and a V1 via 120 formed therein. In other words, metal wire 110 may include a first conductive path 111 and a second conductive path 112 being connected through, and only through, V1 via 120. An electric current, represented by a continuous flow of electrons, may flow from second conductive path 112 to first conductive path 111 via V1 via 120. First and second conductive paths 111 and 112 may both serve as electric input/output ports for the flow of electron current. According to one embodiment, a metal contact layer 130 may be formed on top of V1 via 120 to be in conductive contact with V1 via 120. Metal contact layer 130 may also be known as M2 metal wire or metal link, and is generally conductively insulated from (except through V1 via 120) M1 metal link 110.

According to one embodiment, V1 via 120 has at least a portion being formed below a top surface of and inside M1 metal wire 110. At least a portion of sidewalls of V1 via 120 is formed with vertical conductive liner 121 which serves as a diffusion barrier. For example, assuming electron current flows from port 112 (at right side) to port 111 (at left side) of M1 metal wire 110 during programming, at least the left side sidewall of V1 via 120, where programming electrons exit V1 via 120, is formed or coated with a vertical conductive liner of diffusion barrier 121. In one embodiment, a substantial portion of sidewalls or the entire sidewalls of V1 via 120 is coated with the diffusion barrier 121. The vertical diffusion barrier 121, which may be made of for example titanium (Ti), tantalum (Ta), ruthenium (Ru), tungsten (W), titanium-nitride (TiN), tantalum-nitride (TaN), ruthenium-nitride (RuN), and/or tungsten-nitride (WN), although other suitable materials may also be contemplated, within metal e-fuse 100 provides a blocking boundary for flux divergence during programming.

According to another embodiment of the present invention, e-fuse 100 may be formed to have a proper shape in the M1 metal layer 110. More specifically, a short necking region L1 may be formed to have, for example, approximately 5~20 um in length, and a width W1 that is narrower than input/output ports 111 or 112. Therefore, short necking region L1 formed thereby may effectively induce current crowding and cause localized heating to facilitate the programming of e-fuse 100. A total length L2 from where electron exiting V1 via 120 at diffusion barrier 121 to input/output port 111 may be properly designed to have a length longer than a Blech length and thereby to avoid short-length effect during electromigration.

A Blech length, or $L_{Blech}$, of a conductive material is associated with electro-migration of atoms of the conductive material, and is in general determined by the equation of $L_{Blech}=(jL)_{th}/j$, wherein $(jL)_{th}$ is the Blech threshold of the conductive material and j is a current (or electron) density passing through the conductive material in a direction where the Blech length is measured. For example, the Blech threshold $(jL)_{th}$ of conductive wire is generally affected by the conductivity of material making conductive wire, and for a conductive wire made of copper (Cu), for example, the Blech threshold $(jL)_{th}$ is typically around 200 milliamp per micrometer (mA/μm). The current density may generally be measured, for example, in a unit of milliamp per micrometer square (mA/μm$^2$). Therefore, for a current density of for example 20 mA/μm$^2$ passing laterally through conductive wire, the Blech length may typically be found around 10 micrometers (μm).

According to yet another embodiment, e-fuse 100 may include a sensing wire which allows current to flow through V1 via 120 for detecting status of e-fuse 100 of either open or close circuit. Electric contact may be provided to M2 metal wire 130 to form electric path between M2 metal wire 130 and input/output port 111 or between M2 metal 130 and input/output port 112.

Figure 2A:
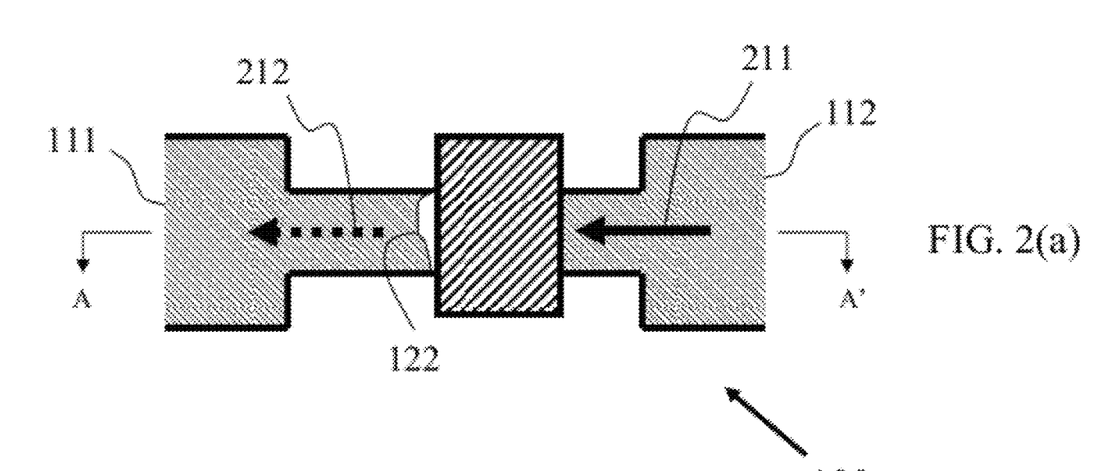
FIGS. 2(a) and 2(b) are demonstrative illustrations of top and side views of programming the e-fuse illustrated in FIG. 1 and structures thereof after being programmed according to one embodiment of the present invention.
Figure 2B:
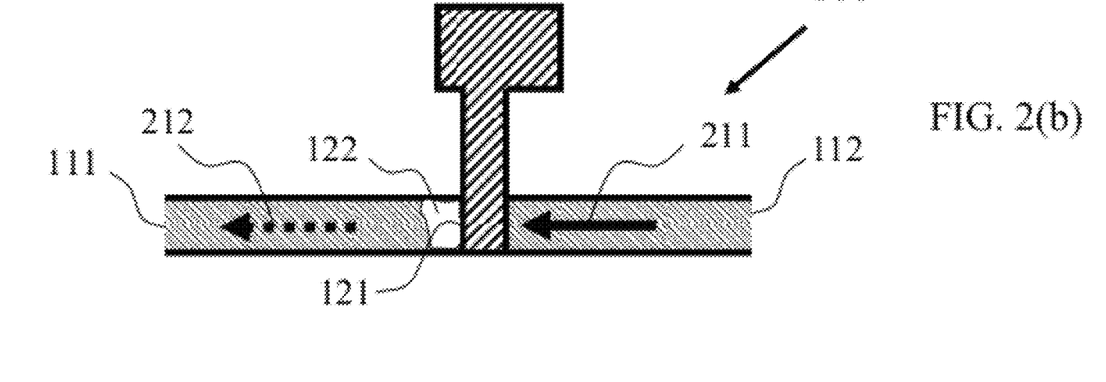

FIGS. 2(a) and 2(b) are demonstrative illustrations of top and side views of programming e-fuse 100 and structure of e-fuse 100 after being programming according to one embodiment of the present invention. For example, during programming e-fuse 100, a programming electron current 211 may be launched from input/output port 112 of M1 metal wire 110 to flow pass through V1 via 120 and exit to become electron current 212 towards input/output port 111. Due to difference in the diffusivity of M1 metal atom, such as copper atom, and that of diffusion barrier layer 121, electro-migration flux divergence occurs at the intersection between diffusion barrier 121 and first conductive path 111 of M1 metal layer 110, causing depletion of metal atoms, at the vicinity of diffusion barrier 121, to create a void 122. According to embodiment of the present invention, void 122 may be sufficiently big to cause dramatic reduction and preferably stop electron flow from second conductive path 112 to first conductive path 111. For example, the electro-migration created void 122 may occupy at least more than half of a cross-section of the first conductive path 111, and preferably separate the rest of first conductive path 111 from V1 via 120 entirely. For example, void 122 may conductively insulate first conductive path 111 from V1 via 120 after programming. In FIG. 2(b), dashed arrow 212 is used to indicate that once void 122 is created causing an open circuit in the M1 metal 110, electron will no longer flows in the direction pointed by arrow 212.

Figures 3A, 3B:
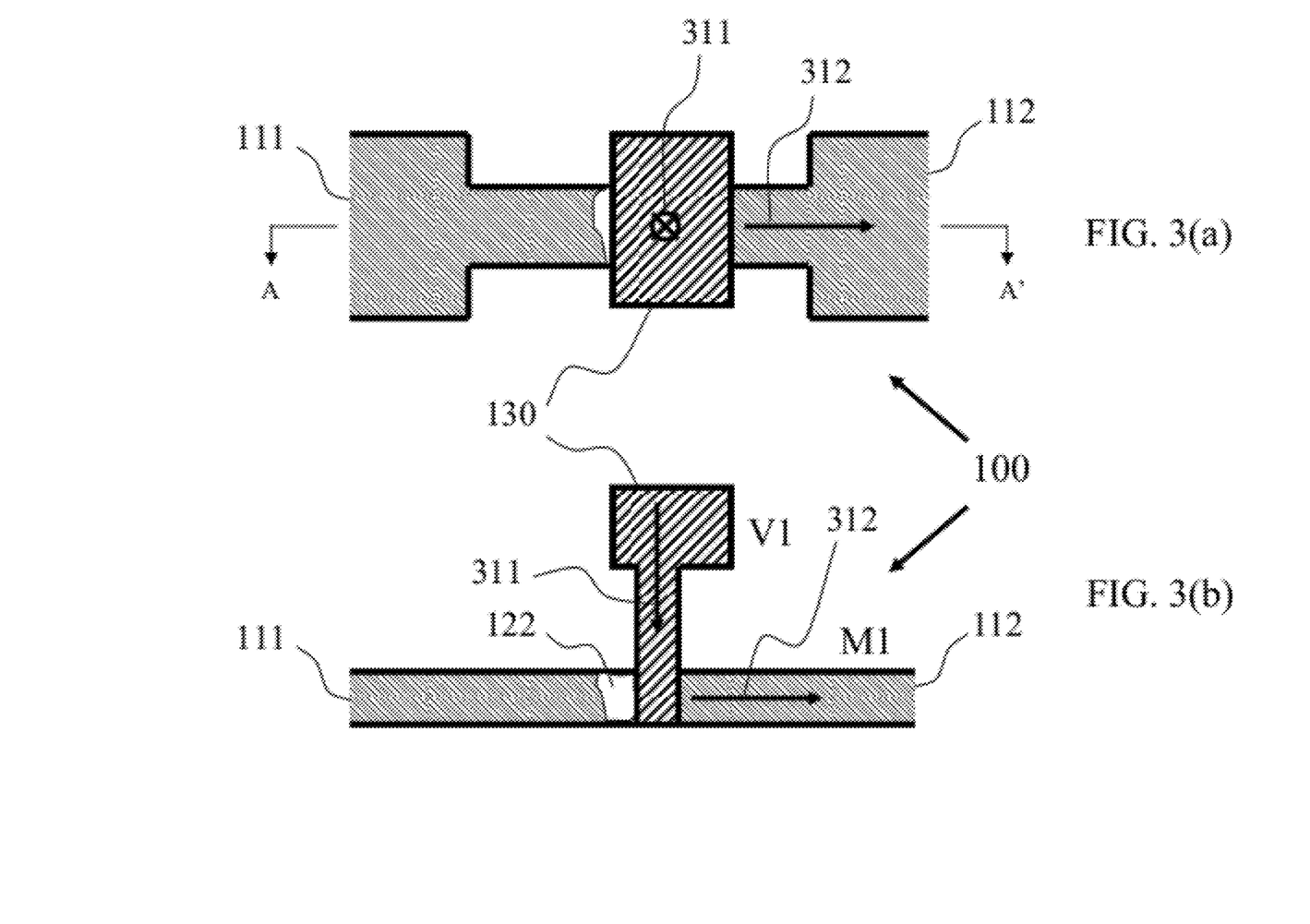
FIGS. 3(a) and 3(b) are demonstrative illustrations of top and side views of sensing the e-fuse illustrated in FIG. 1 and structures thereof after being programmed according to one embodiment of the present invention.

FIGS. 3(a) and 3(b) are demonstrative illustrations of top and side views of sensing the e-fuse illustrated in FIG. 1 and structures thereof after being programmed according to one embodiment of the present invention. For example, an electron current may be flowed from M2 metal wire 130 through V1 via 120 toward input/output port 111 of M1 metal 110 (or in a reverse direction), and electrons may normally be detected at port 111 when e-fuse 100 is in un-programmed condition. After e-fuse 100 being programmed and void 122 is created, the electric path from M2 metal wire or M2 metal layer 130 to port 111 of M1 metal wire 110 becomes open and no electrons may flow in-between. On the other hand, since void is created inside first conductive path 111, to the left side of V1 via 120, electron may still flow from M2 metal wire 130 to port 112 of M1 metal 110. By detecting the existence of a "close" circuit between M2 metal wire 130 and second conductive path 112 but an "open" circuit between M2 metal wire 130 and first conductive path 111, it may be determined that void is created inside first conductive path 111.

FIGS. 4(a) to 4(d) are simplified demonstrative illustrations of a method of manufacturing e-fuse 100 in FIG. 1 according to an embodiment of the present invention. For example, an embodiment of the present invention may include, first, providing an inter-level dielectric (ILD) layer 410 thereupon e-fuse 100 may be formed. As is known by a person skilled in the art, ILD layer 410 may be an insulating dielectric layer deposited on top of other back-end-of-line (BEOL) interconnect structures and/or deposited directly on top of a semiconductor substrate which may have manufactured thereupon various active and/or passive semiconductor devices such as, for example, field-effect-transistors.

Figure 4A:
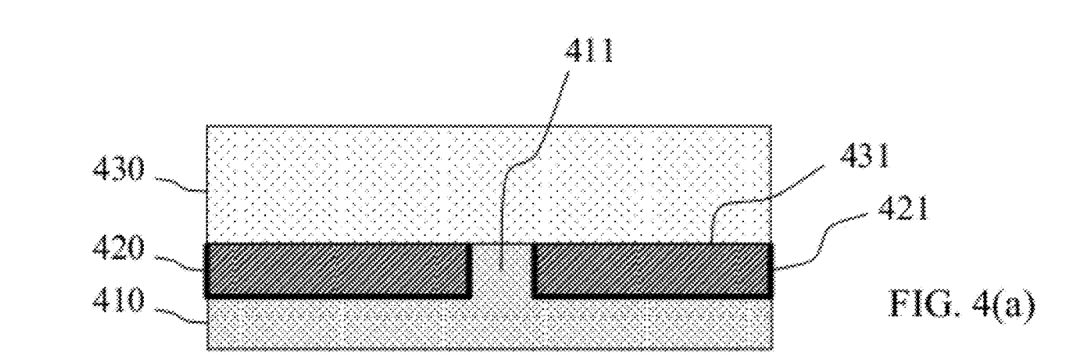
FIGS. 4(a) and 4(d) are demonstrative illustrations of a method of manufacturing the e-fuse illustrated in FIG. 1 according to one embodiment of the present invention.
Figure 4B:
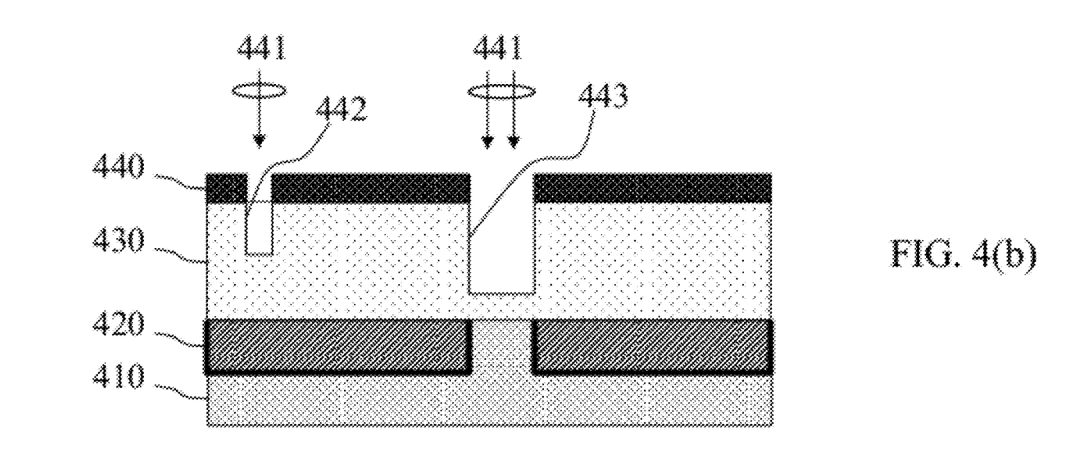

According to one embodiment of the invention, the method may include forming conductive paths 421 (including a first conductive path at the left and a second conductive path at the right) of M1 metal layer 420 on top of ILD layer 410 or at a top portion of ILD layer 410, with a portion of ILD layer 411 being left between conductive paths 421. When forming conductive paths 421 on top of ILD layer 410, the method may include depositing another ILD layer 411 on top of ILD layer 410. ILD layer 411 may include same dielectric material as that of ILD layer 410; and may have preferably a thickness close to that of M1 metal layer 420 to be formed therein. It is to be understood that embodiments of the invention are not limited in this aspect, and different dielectric materials and/or different thickness may be used in forming ILD layer 411. Conductive path 421 may be formed to pass electric power or electrons during programming of e-fuse 100.

Whether being formed inside ILD layer 410 or in the additionally formed ILD layer 411, according to one embodiment, a standard photolithographic process may be used to create a pattern of conductive path 421 and a selective etching process may be used to transfer the pattern into ILD layer 411 (or a top portion of ILD layer 410) to form openings for conductive paths. Conductive materials such as metal or metal alloy may subsequently be used to fill the openings to form, inside ILD layer 411, conductive paths 421. An embodiment of the present invention may include forming or creating conductive paths 421 by applying other suitable existing BEOL processes and/or future develop techniques, and may include depositing a conductive metal liner on top of ILD layer 410 first before forming conductive path 421 through metal deposition. Materials suitable for conductive path 421 may include, for example, copper (Cu), aluminum (Al), silver (Ag), gold (Au), and/or alloy thereof.

As is shown in FIG. 4(a), conductive paths 421 may include first and second conductive paths 421. Between the first and second conductive paths, a V1 via may be formed to conductively connect first and second conductive paths by replacing the portion of ILD layer 411 in-between with another conductive material. A lateral size of this ILD layer 411 (being replaced) may be determined by the type and property, for example conductivity, of the conductive material used for the V1 via. However, it is to be understood that embodiments of the present invention are not limited in this aspect. For example, embodiment of the invention may include forming a continuous conductive path 421, and then etching a portion of the continuous path 421 away to be replaced by a conductive V1 via.

After forming M1 metal wire 421, an embodiment of the present invention may include depositing a dielectric capping layer 431 on top of conductive path 421 and ILD layer 411, and then depositing another ILD layer 430 on top of dielectric capping layer 431. The use of dielectric capping layer 431 may help prevent contamination of materials of conductive path 421 into ILD layer 430 and thereby improve overall isolation and/or insulation of conductive path 421.

After the formation of ILD layer 430, an embodiment of the invention may include depositing a photo-resist layer 440 on top of ILD layer 430 and creating a pattern of V1 via in photo-resist layer 440 among other patterns like. As being illustrated in FIG. 4(b), V1 via pattern may subsequently be transferred to underneath ILD layer 430 through a RIE process 441 such that via holes 442 and 443 may be created partially inside ILD layer 430. Following the partial creation of via holes 442 and 443, photo-resist pattern 440 may be removed or lifted through appropriate chemical solution.

Figure 4C:
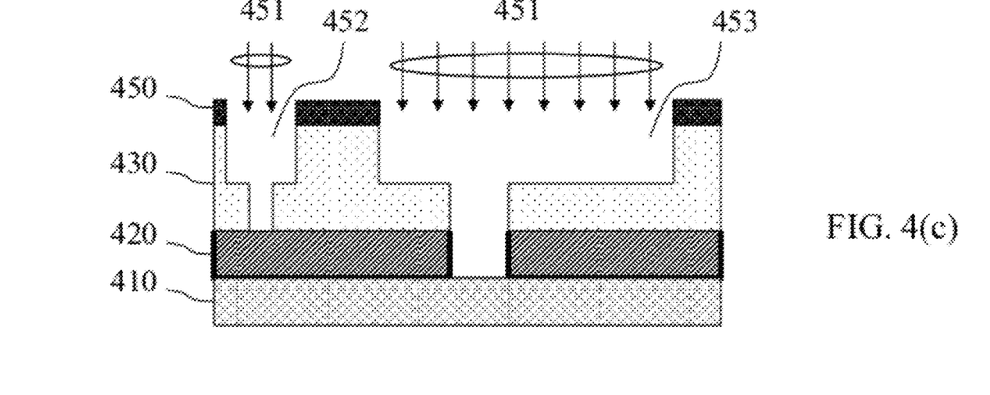

Next, as being illustrated in FIG. 4(c), a second photoresist layer 450 may be deposited on top of ILD layer 430 and a photo-resist pattern representing M2 metal layer may be created through well known photolithographic process. The pattern of M2 metal contact may be subsequently transferred to ILD layer 430, superimposed on top of V1 via pattern such as via holes 442 and 443. The etching process of creating opening for M2 metal layer may further cause etching of via hole 442 down to M1 layer 420, and via hole 443 down to M1 layer 420 and further through the remaining ILD layer 411 down to below the top surface of M1 metal layer 420.

Figure 5A:
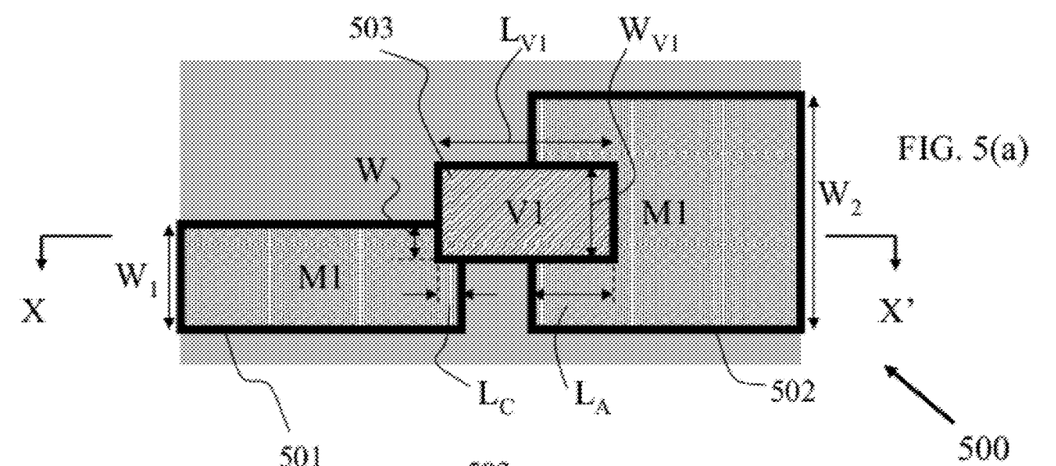
FIGS. 5(a) and 5(b) are demonstrative illustrations of top and side views of structure of an electronic fuse (e-fuse) manufactured according to another embodiment of the present invention.

In one embodiment, the etching may create an opening whose bottom exposes ILD layer 410 and may have a bottom surface that is at or below the bottom surface of M1 metal layer 420. In another embodiment, the etching may create an opening whose bottom exposes ILD layer 410 and may have a bottom surface that is above the bottom surface of M1 metal layer 420 but below the top surface of M1 metal layer 420, as being described below in more details with reference to FIG. 5.

Figure 4D:
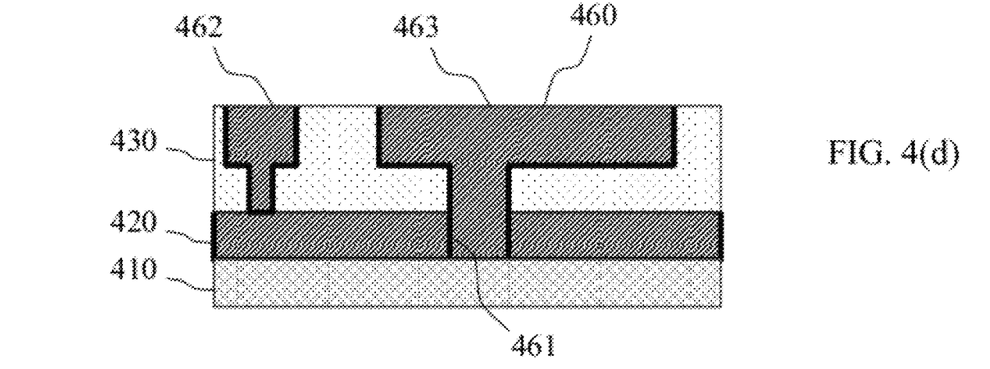

Next, as being illustrated in FIG. 4(d), an embodiment of the present invention may include depositing a conductive liner 461, for example a metal liner, over the inner sidewalls and bottom of via hole 443 inside ILD layer 430 and between conductive paths 421. Conductive liner 461 may serve as a diffusion barrier or diffusion barrier layer. Material of conductive liner 461 may include, for example, titanium (Ti), tantalum (Ta), ruthenium (Ru), tungsten (W) and nitride thereof such as, titanium-nitride (TiN), tantalum-nitride (TaN), ruthenium-nitride (RuN), and/or tungsten-nitride (WN), although other suitable materials may also be contemplated. Conductive liner 461 may also be formed by any other conductive material that may serve as a barrier and is capable of preventing conductive materials such as copper from diffusing there through.

Following the formation of conductive liner 461, an embodiment of the invention may include depositing a conductive material 460 into via hole 442 and 443 and openings thereupon to form M2 metal layer 460, thereby creating metal contacts 462 and 463 with metal contact 463 including a V1 via to reach between first and second conductive paths of M1 metal layer 420. The conductive material making M2 metal layer 460 may include, for example, tungsten (W), aluminum (Al), copper (Cu), silver (Ag), gold (Au), and alloy thereof.

Figure 5B:
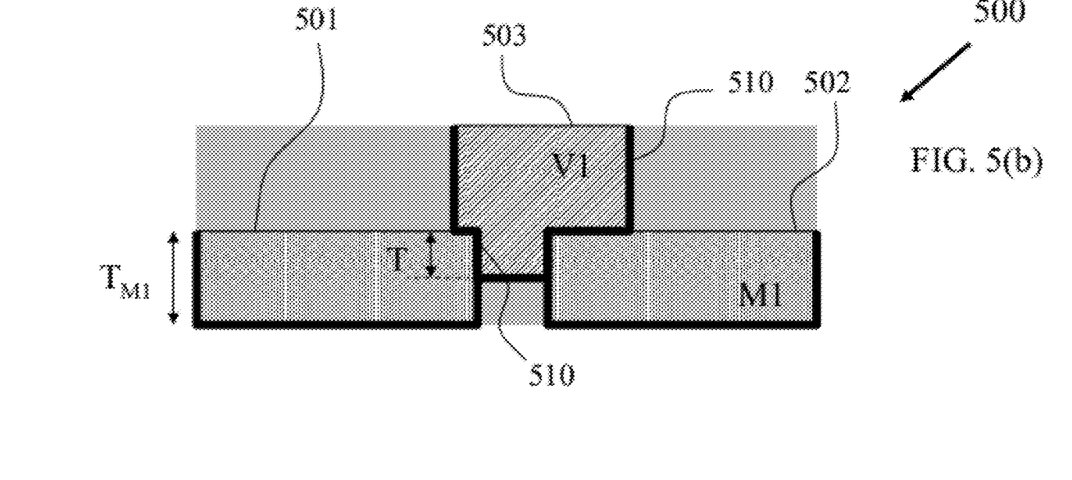

FIGS. 5(a) and 5(b) are demonstrative illustrations of top and side views of structure of an electronic fuse (e-fuse) manufactured according to another embodiment of the present invention. More specifically, embodiment of the present invention includes a V1 via 503 that has an upper portion that is in contact, at a bottom surface thereof, with a portion of top surface of M1 metal layer (501 and 502). The upper portion of V1 via 503 has a length Lv1 and a width Wv1. V1 via 503 also includes a lower portion that conductively connects a first section (or first conductive path) 501 and a second section (or second conductive path) 502 of M1 metal layer.

According to one embodiment of the present invention, in order to reduce programming power, an overlapped portion of V1 via 503 with first section 501 of M1 metal layer, where electrons exit V1 via 503 to cause at least one void and possibly multiple voids in first section 501 of M1 metal layer, may have a width W that is between 20 to 100% of the V1 via 503 width Wv1 and a length $L_C$ between about 10 to 30% of the V1 via 503 length Lv1 (FIG. 5(a)). On the other hand, in order to reduce resistance of the e-fuse when under un-programmed status, conductive paths of M1 metal layer may be preferably made bigger than V1 via 503. For example, width of first section 501 (W1) of M1 metal layer may be made between 100 to 300% of the V1 via width Wv1 and width of second section 502 (W2) of M1 metal layer may be made between 150 to 500% of the V1 via width Wv1. In addition, V1 via 503 and second section 502 of M1 metal layer may be made to have an overlapped region whose length $L_A$ is about 50% of the total length of V1 via 503 length Lv1. In forming V1 via 503, a conductive liner 510 is deposited around sidewalls of V1 via 503. Conductive liner 510 has a higher resistance (or lower conductivity) than the conductive material of M1 metal layer, in particular than the material of the first section 501 of M1 metal layer. The lower conductivity helps creating one or more voids next to V1 via 503 during programming when a large flow of electrons pass through the interface between V1 via 503 and first section (or first conductive path) of M1 metal layer.

Figure 6A:
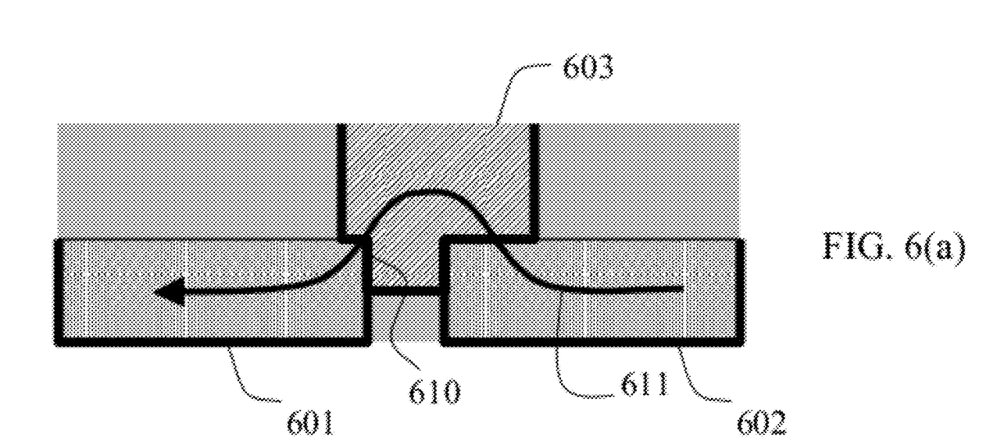
FIGS. 6(a) and 6(b) are demonstrative illustrations of top and side views of programming the e-fuse illustrated in FIG. 5 and structures thereof after being programmed according to one embodiment of the present invention.
Figure 6B:
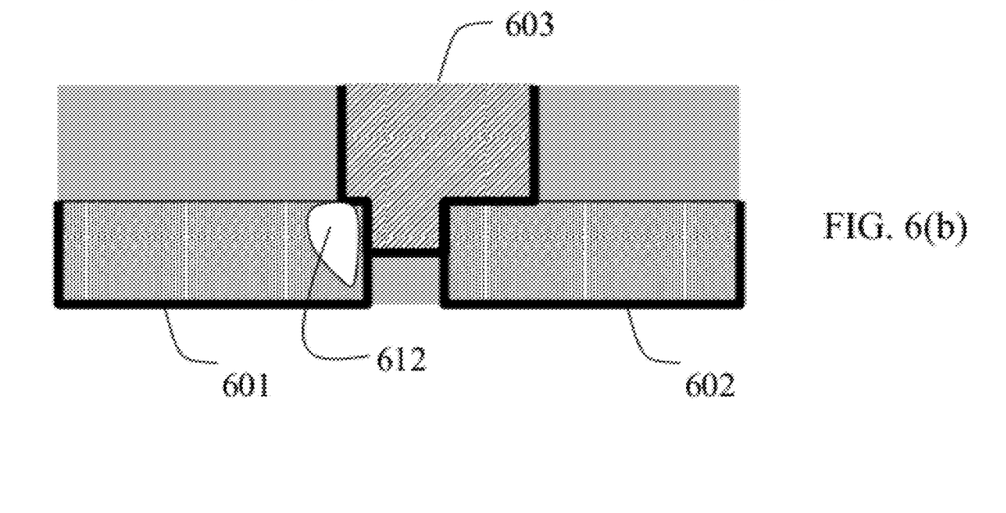

FIGS. 6(a) and 6(b) are demonstrative illustrations of top and side views of programming the e-fuse illustrated in FIG. 5 and structure thereof after being programmed according to one embodiment of the present invention. For example, during programming when a positive voltage is applied from first section 601 (corresponding to section 501 in FIG. 5) to second section 602 (corresponding to section 502 in FIG. 5) of M1 metal layer, electrons 611 may flow, against the direction of voltage being applied, from second section 602 of M1 metal layer to first section 601 of M1 metal layer, through V1 via 603 (corresponding to V1 via 503 in FIG. 5). Comparing with crossing from V1 via 603 to the first section 601 of M1 metal layer, electrons may experience relatively less resistance when crossing from the second section 602 of M1 metal layer to V1 via 603 due to relatively large interface therebetween and therefore larger conductivity/lower resistance.

On the other hand, due to difference in diffusivity of M1 metal atom such as copper atom, within diffusion barrier layer 610, and that within M1 metal, electromigration flux divergence occurs at the intersection between diffusion barrier 610 and first section 601 of M1 metal layer causing depletion of metal atoms, at the vicinity of diffusion barrier 610, to create a void 612. When the electrons flow from V1 via 603 to first section 601 of M1 metal layer, due to conductive liner 610 serving as diffusion barrier layer and creating electro-migration flux divergence there, electro-migration induced void 612 is formed adjacent to the interface between V1 via 603 and first section 601 of M1 metal layer. The formation of void 612 successfully programs the e-fuse with predicable location for the void.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A semiconductor structure comprising:
   a via of a first conductive material having a bottom and sidewalls, at least a portion of said sidewalls being covered by a conductive liner, said bottom of said via being formed directly on top of a dielectric layer; and
   a first and a second conductive path of a second conductive material formed on top of said dielectric layer, said first and second conductive paths being conductively connected through, and only through, said via at said sidewalls,
   wherein conductivity of at least said first conductive path is greater than conductivity of said conductive liner covering said via at said portion of said sidewalls with said portion of said sidewalls being a sidewall between said first conductive path and said via, and wherein at least one void exists inside said first conductive path at a location adjacent to said portion of said sidewalls, wherein said at least one void being caused by electro-migration and occupying more than half of a cross-section of said first conductive path.

2. The semiconductor structure of claim 1, wherein said bottom and said sidewalls of said via are fully covered by said conductive liner.

3. The semiconductor structure of claim 1, wherein a lateral dimension of said via measured by two of said sidewalls opposing each other is less than a Blech length, said Blech length being associated with electro-migration of metal atoms inside said via and being affected at least partially by properties of said first conductive material of said via.

4. The semiconductor structure of claim 3, wherein said first conductive material is copper (Cu) and wherein said Blech length inside said via is approximately 10 micrometers or less.

5. The semiconductor structure of claim 1, wherein said first conductive material is selected from a group consisting of tungsten (W), aluminum (Al), copper (Cu), silver (Ag), gold (Au), and alloy thereof, and said second conductive material is selected from a group consisting of aluminum (Al), copper (Cu), silver (Ag), gold (Au), and alloy thereof.

6. The semiconductor structure of claim 1, wherein said conductive liner is made of a material being selected from a group consisting of titanium (Ti), tantalum (Ta), ruthenium (Ru), tungsten (W), titanium-nitride (TiN), tantalum-nitride (TaN), ruthenium-nitride (RuN), and tungsten-nitride (WN), and wherein said conductive liner is capable of preventing said first conductive material of said via from diffusing therethrough.

7. An electronic fuse comprising:
a via of a first conductive material having a bottom and sidewalls with said bottom being formed directly on top of a dielectric layer;
a first conductive path being formed on top of said dielectric layer at a first side of said via and being separated from said sidewalls of said via by a void; and
a second conductive path being formed on top of said dielectric layer at a second different side of said via and being in conductive contact with said via through said sidewalls,
wherein a portion of said sidewalls being separated from said first conductive path is covered by a conductive liner, and wherein said first and second conductive paths being made of a second conductive material.

8. The programmed electronic fuse of claim 7, wherein said via is conductively connected to a metal contact layer, said metal contact layer being formed above, and separated from, said first and second conductive paths.

9. The programmed electronic fuse of claim 7, wherein said metal contact layer and said second conductive path, through said via, form a continuous conductive path and is adapted to pass a sensing electron current from said second conductive path to said metal contact layer through said via.

10. The programmed electronic fuse of claim 7, wherein said metal contact layer and said via are conductively insulated from said first conductive path by said void.

11. An electronic fuse comprising:
a via of a first conductive material having a bottom and sidewalls, said sidewalls being covered by a conductive liner, said bottom being formed directly on top of a dielectric layer; and
a first and a second conductive path of a second conductive material formed on top of said dielectric layer, said first and second conductive paths being conductively connected to each other through, and only through, said via at said sidewalls,
wherein one or more voids exist adjacent to said sidewalls of said via inside at least one of said first and second conductive paths, wherein said voids being caused by electro-migration and occupying a substantial portion of a cross-section of said at least one of said first and second conductive paths.

12. The electronic fuse of claim 11, wherein said dielectric layer is a first dielectric layer, further comprising a metal contact layer formed on top of and in conductive contact with said via, said metal contact layer being conductively insulated, except through said via, from said first and second conductive paths by a second dielectric layer.

13. The electronic fuse of claim 12, wherein said second conductive path is adapted to pass an electron current represented by a flow of electrons in a direction towards said first conductive path through said via, said flow of electrons being sufficiently large to create a void in said first conductive path at a location adjacent to said sidewalls facing said first conductive path.

14. The electronic fuse of claim 13, wherein said metal contact layer is adapted to pass an electric current through said via and through said second conductive path to confirm electronic continuity thereof after said void being created inside said first conductive path next to said via.

15. The electronic fuse of claim 13, wherein no electric current is able to pass from said metal contact layer through said via and through said first conductive path after said void is created.

16. The electronic fuse of claim 11, wherein conductivity of at least said first conductive path is greater than conductivity of said conductive liner covering said via at said sidewalls.

* * * * *